United States Patent
Bailey, III et al.

(10) Patent No.: US 8,440,051 B2
(45) Date of Patent: May 14, 2013

(54) PLASMA PROCESSING CHAMBER FOR BEVEL EDGE PROCESSING

(75) Inventors: Andrew D. Bailey, III, Pleasanton, CA (US); Yunsang Kim, Monte Sereno, CA (US)

(73) Assignee: Lam Research Corporation, Fremont, CA (US)

( * ) Notice: Subject to any disclaimer, the term of this patent is extended or adjusted under 35 U.S.C. 154(b) by 101 days.

(21) Appl. No.: 13/082,393

(22) Filed: Apr. 7, 2011

(65) Prior Publication Data

US 2011/0180212 A1    Jul. 28, 2011

Related U.S. Application Data

(62) Division of application No. 11/818,621, filed on Jun. 14, 2007, now Pat. No. 8,268,116.

(51) Int. Cl.
*C23F 1/00* (2006.01)
*H01L 21/306* (2006.01)

(52) U.S. Cl.
USPC .............. 156/345.49; 156/345.3; 156/345.42; 156/345.47

(58) Field of Classification Search ........... 156/345.3, 156/345.42, 345.46, 345.49, 345.4, 345.497
See application file for complete search history.

(56) References Cited

U.S. PATENT DOCUMENTS

| | | | | |
|---|---|---|---|---|
| 5,021,114 A | * | 6/1991 | Saito et al. | 156/345.42 |
| 5,993,293 A | * | 11/1999 | Cesna et al. | 451/41 |
| 6,326,307 B1 | * | 12/2001 | Lindley et al. | 438/689 |
| 2002/0022281 A1 | * | 2/2002 | Flanner et al. | 438/8 |
| 2003/0042227 A1 | * | 3/2003 | Fink | 216/63 |
| 2004/0238488 A1 | * | 12/2004 | Choi et al. | 216/58 |
| 2004/0265903 A1 | * | 12/2004 | Mueller et al. | 435/7.1 |
| 2005/0178505 A1 | * | 8/2005 | Kim | 156/345.47 |
| 2006/0081559 A1 | * | 4/2006 | Miyata et al. | 216/67 |
| 2006/0152163 A1 | * | 7/2006 | Miki et al. | 315/111.21 |
| 2008/0179297 A1 | * | 7/2008 | Bailey et al. | 219/69.15 |

* cited by examiner

*Primary Examiner* — Keath Chen
(74) *Attorney, Agent, or Firm* — Martine Penilla Group, LLP

(57) ABSTRACT

Chambers for processing a bevel edge of a substrate are provided. One such chamber includes a bottom electrode defined to support a substrate in the chamber. The bottom electrode has a bottom first level for supporting the substrate and a bottom second level near an outer edge of bottom electrode. The bottom second level is defined at a step below the bottom first level. Further included is a top electrode oriented above the bottom electrode. The top electrode having a top first level and a top second level, where the top first level is opposite the bottom first level and the top second level is opposite the bottom second level. The top second level is defined at a step above the top first level. A bottom ring mount oriented at the bottom second level is included. The bottom ring mount includes a first adjuster for moving a bottom permanent magnet toward and away from the top electrode. Further included is a top ring mount oriented at the top second level. The top ring mount includes a second adjuster for moving a top permanent magnet toward and away from the bottom electrode.

17 Claims, 13 Drawing Sheets

PLASMA PROCESSING CHAMBER FOR BEVEL EDGE PROCESSING

CLAIM OF PRIORITY

This is a divisional application of U.S. patent application Ser. No. 11/818,621, filed on Jun. 14, 2007, entitled "Methods and Apparatus for Protecting A Region of Process Exclusion Adjacent To A Region of Process Performance In A Process Chamber," now U.S. Pat. No. 8,268,116, and is herein incorporated by reference.

CROSS REFERENCE TO RELATED APPLICATION

This application is related to U.S. patent application Ser. No. 11/701,854, filed on Feb. 2, 2007, now U.S. Pat. No. 7,575,638, and entitled "Apparatus For Defining Regions Of Process Exclusion And Process Performance In A Process Chamber." The disclosure of the above-identified related application is incorporated herein by reference.

BACKGROUND

Vacuum processing chambers have been used for etching materials from substrates and for deposition of materials onto substrates. The substrates have been semiconductor wafers, for example. In general, accurate processing (and thus high yields of active devices) is expected to occur in a central area of the wafer (i.e., in an active device region). Numerous difficulties are experienced in attempting to accurately process the wafer between the central area and a peripheral edge of the wafer that surrounds the central area on a top, or upper, surface of the wafer that is to be processed to form the devices. Such difficulties are significant enough that an "edge exclusion area" has been defined between the central area and that edge of the wafer. No attempt is made to provide acceptable devices in that edge exclusion area.

Additionally, during the desired processing of the central area, undesired deposits, materials, or process-by-products (collectively "undesired materials") accumulate or result on the edge exclusion area of the upper surface of the wafer, and on a beveled edge area around the peripheral edge of the wafer, and below the beveled edge area onto a bottom area of an opposite (bottom) surface of the wafer. The edge exclusion area, the beveled edge area, and the bottom area are referred to herein collectively as the "edge environ". The edge environ is not to be processed to form devices. These undesired materials may generally accumulate on the edge environ. In general, it is desired to keep the edge environ substantially clean, so as to avoid flaking of material particulates that may redeposit back onto the active device regions on the upper surface of the wafer. Such flaking can occur during any number of wafer handling or transport operations, and thus, it is a general desire that the edge environ be periodically cleaned (e.g., etched) to remove the undesired materials from the processed wafers. During a removal, or cleaning, process the edge environ is a region of process (cleaning) performance, and the central area of the active devices is a region of process exclusion.

In view of the foregoing, there are needs for methods and apparatus for removing the undesired materials from only the edge environ and not damaging the central area.

SUMMARY

Broadly speaking, embodiments of the present invention fill these needs by providing ways of protecting the central area so that during the removing of the undesired materials from only the edge environ the central area is not damaged. The ways preferably include use of electric and magnetic field strengths configured to protect the central area from charged particles from plasma in a process chamber. Such field strengths foster removal of the undesired materials from only the edge environ. In one embodiment, the magnetic field is configured with a peak located adjacent to a border between the central area and the edge environ, and the configuration provides a strong gradient extending from the peak radially away from the border and away from the central area to repel the charged particles from crossing the border.

It should be appreciated that the present invention can be implemented in numerous ways, including as an apparatus, a method and a system. Several inventive embodiments of the present invention are described below.

In one embodiment, chambers for processing a bevel edge of a substrate are provided. One such chamber includes a bottom electrode defined to support a substrate in the chamber. The bottom electrode has a bottom first level for supporting the substrate and a bottom second level near an outer edge of bottom electrode. The bottom second level is defined at a step below the bottom first level. Further included is a top electrode oriented above the bottom electrode. The top electrode having a top first level and a top second level, where the top first level is opposite the bottom first level and the top second level is opposite the bottom second level. The top second level is defined at a step above the top first level. A bottom ring mount oriented at the bottom second level is included. The bottom ring mount includes a first adjuster for moving a bottom permanent magnet toward and away from the top electrode. Further included is a top ring mount oriented at the top second level. The top ring mount includes a second adjuster for moving a top permanent magnet toward and away from the bottom electrode.

In one embodiment, apparatus is provided for protecting a central area of a wafer from charged particles in a process chamber. A first electrode is configured to mount the wafer in the process chamber with the central device area within a device border centered on a wafer axis and with a wafer edge exclusion area extending radially away from both the axis and the border. A second electrode is configured with a field ring mount section extending radially from the border and away from the axis and being located adjacent to the border. A field ring arrangement is configured to establish a field capable of exerting force on the charged particles to repel the particles from moving to the central device area. The field ring arrangement is mounted in the field ring mount section and is configured so that the field has a field strength gradient configured with a peak value adjacent to the border. The field strength gradient defines increasing field strength inversely proportional to increased radial distance away from the axis and away from the border. The gradient and the peak value of the field strength repel the charged particles from moving radially past the border toward the axis.

In another embodiment, apparatus for protecting a central area of a wafer from charged particles in a process chamber may include a first electrode configured to mount the wafer in the process chamber. The mounting is with the central area within a circular wafer border centered on a wafer axis and with a wafer edge exclusion area extending radially relative to the axis and outside the border. The first electrode may be further configured with a first ring mount section. A second electrode may be configured with a second ring mount section extending radially relative to the border and away from the axis. A ring-shaped permanent magnet arrangement may be configured with a first permanent magnet section mounted in the first ring mount section and a second permanent magnet section mounted in the second ring mount section. The first and second mounted permanent magnet sections may be configured to establish a magnetic field that extends axially between the first and second mounted permanent magnet sections and in an annular path centered on the axis. The first and second mounted permanent magnet sections may be further configured to establish the magnetic field configured with a magnetic field strength that is uniform around the wafer axis and that has a field strength gradient that varies with respect to radial distance relative to the axis and away from the border. The gradient variation may be from a peak value located adjacent to the border and inversely proportional to increased radial distance away from the axis. The gradient and the peak value of the field strength may be configured to repel the charged particles from moving radially past the border toward the axis.

In yet another embodiment, apparatus may protect a central area of a wafer from charged particles in a process chamber. A first electrode may be configured with a wafer support to mount the wafer to be processed in the process chamber, the wafer being configured with an axis and the central area being defined by a circular border centered on the axis. The border may be configurable at any of a plurality of radial distances relative to the axis and be surrounded by an annular edge exclusion area. The first electrode may be further configured with a first electrically grounded ring extending in an annular path radially outward of the edge exclusion area and electrically isolated from the wafer support. Different configurations of the edge exclusion area may be defined by the border positioned at different ones of the plurality of radial distances relative to the axis. A second electrode may be configured with a center area opposite to the central area and with a first annular mount section aligned with the border. The second electrode may be further configured with a second electrically grounded ring extending in an annular path radially outward of the edge exclusion area and electrically isolated from the center area and from the first annular mount section. The first annular mount section may be electrically isolated from the center area. A DC bias ring is secured to the first annular mount section to establish an electric field in the process chamber. The DC bias ring is configured so that the electric field extends away from the circular border and across the edge exclusion area to each of the first and second grounded rings to repel the charged particles from crossing the border and promote etching of the edge exclusion area. A DC control circuit applies a DC voltage to the DC bias ring, a value of the DC voltage being directly proportional to a value of the radial distance of the border relative to the axis In still another embodiment, a method protects the central area of the wafer from charged particles during etching of the edge exclusion area surrounding the circular border that defines the central area. An operation may mount the wafer in an etching chamber with the edge exclusion area extending in a radial direction outside the border. Another operation may establish a constant magnetic field between opposite permanent magnet polarities so that a peak value of magnetic field strength is adjacent to the border and the magnetic field strength decreases suddenly from the peak value with increased distance away from the border and from the axis. The peak value of the magnetic field and sudden decrease of the magnetic field strength repel movement of charged particles past the border to the central region and promote bombardment of the edge exclusion area by the repelled particles.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION

Figure 1:
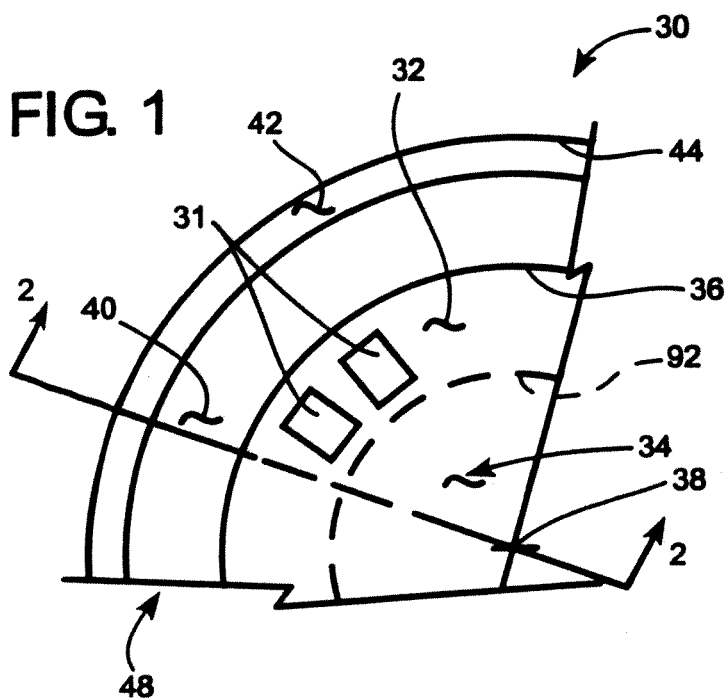
FIG. 1 shows a schematic plan view of one-quarter of a substrate on which accurate processing (and thus high yields of active devices) is expected to occur in a central area of a top surface of the substrate.

In the following description, numerous specific details are set forth in order to provide a thorough understanding of embodiments of the present invention. It will be apparent, however, to one skilled in the art that the present invention may be practiced without some or all of these specific details. In other instances, well known process operations have not been described in detail in order not to obscure the present invention.

With the above considerations in mind, the following will define several exemplary circuit and system configurations. However, it should be understood that modifications may be possible, as defined by the appended claims. Specifically, although reference is made to certain circuit designs, it should be understood that the functionality can be implemented in a number of forms. For instance, the functionality performed by circuits (e.g., analog and digital), can be re-rendered into firmware. Additionally, firmware can be executed alone or in conjunction with software control or assistance to complete or partially complete processing steps or communication.

Embodiments of an invention are described for apparatus, systems for use, and methods for protecting an edge environ of a substrate such as a semiconductor wafer, so that during the removing of undesired materials from only the edge environ a central area of the wafer is not damaged. In these embodiments, electric and magnetic field strengths may be configured to protect the central area from charged particles from plasma in a process chamber. The field strengths foster removal of the undesired materials from only the edge environ. In another embodiment, the magnetic field is configured with a peak located adjacent to a border between the central area and the edge environ, and the configuration provides a strong magnetic field gradient extending from the peak radially away from the border and away from the central area to repel the charged particles from crossing the border.

The word "substrate," as used herein, denotes without limitation, semiconductor wafers, hard drive disks, optical discs, glass substrates, and flat panel display surfaces, liquid crystal display surfaces, etc., on which materials or layers of various materials may be formed or defined in a processing chamber, such as a chamber in which a plasma is established for processing, e.g., etching or deposition.

For each type of substrate (also referred to herein as a "wafer"), accurate processing (and thus high yields of active devices) is expected to occur in the central area of the top surface of the substrate. The central area may be defined by a border, such as an exemplary circular border centered on a center axis of the substrate. The border may thus encompass the central area on which the devices are intended to be formed. The border may also indicate an annular area on the top surface, the annular area being radially outward from the border and extending to a bevel that is next to an outer edge of the substrate. The annular area surrounds the border, is not to be processed to form devices, and is referred to as the "edge exclusion area". The "edge environ" of the substrate collectively refers to the edge exclusion area, the bevel, the outer edge, and a bottom area under the top surface. During the desired processing of the central area to form the desired active devices, the undesired materials may accumulate on the edge environ. To avoid flaking of material particulates that may redeposit back onto active device regions on the central area, embodiments of the present invention may be used to periodically clean (e.g., etch) the undesired materials from the edge environ of the processed substrates.

FIG. 1 shows a schematic plan view of one-quarter of a substrate 30 on which accurate processing (and thus high yields of active devices 31) is expected to occur in a central area 32 of a top surface 34 of the substrate. The central area 32 may be defined by a border 36, such as an exemplary circular border centered on a center axis 38 of the substrate 30. Other shapes of the central area 32 may be provided, for example, but in each case the border 36 may encompass (or enclose) the central area 32 on which the devices 31 are intended to be formed. The border 36 also indicates (or serves to define) another area 40 on the top surface 34. When the substrate 30 is a semiconductor wafer, for example, the area 40 may be annular, centered on the axis 38, and extend radially outward from the border 36 to a bevel 42 next to an outer edge 44 of the substrate. Other shapes of the area 40 may be provided, for example, but in each case the other area 40 is an area on which no devices 31 are to be formed. The border 36 is used herein to define a line of transition between the central (active device) area 32 and the other (no device) area 40. The other area 40 surrounds the border 36, and is referred to herein as the "edge exclusion area". The edge exclusion area 40, the bevel 42, the outer edge 44, and a bottom surface 46 (FIG. 2) under the top surface 34 are included in the "edge environ" 48 of the substrate 30.

The word "axial" as used herein defines a direction parallel to the axis 38, and is also used in the form of "axially" to define an item extending in the axial direction (i.e., extending parallel to the axis 38). The word "radial" as used herein defines a direction perpendicular to and centered on the axis 38, and is also used in the form of "radially" to define a radius extending perpendicular to the axial direction (i.e., extending perpendicular to the axis 38).

Figure 2:
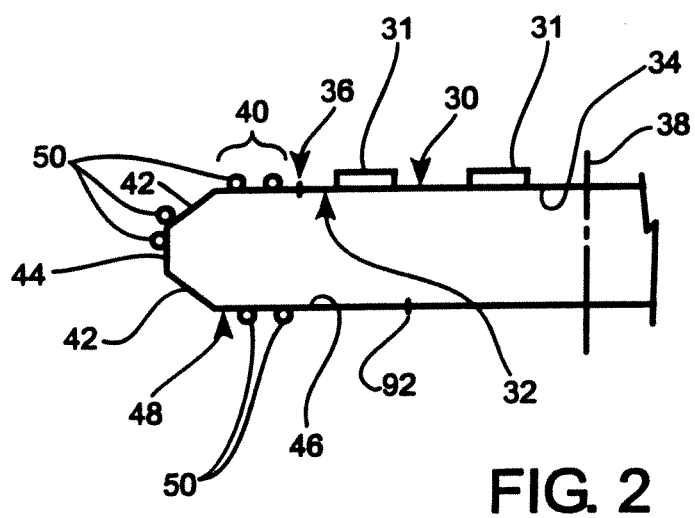
FIG. 2 shows a schematic elevational view of the substrate of FIG. 1.
Figure 3:
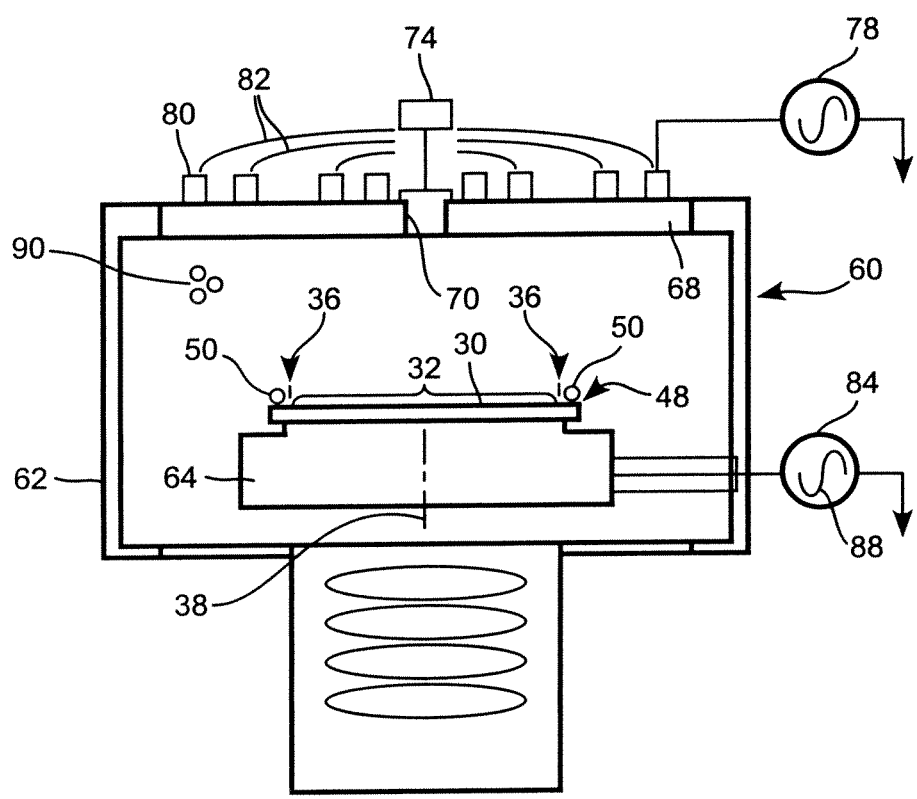
FIG. 3 is a schematic view showing an embodiment of apparatus of the present invention for cleaning an edge environ of the substrate while protecting the central area.

FIG. 2 shows a schematic elevational view of the substrate 30. FIGS. 1 & 2 illustrate that during the desired processing of the central area 32 to form the desired active devices 31, undesired materials 50 may accumulate on the edge environ 48. To avoid flaking of material particulates that may redeposit back onto the active devices 31 on the central area 32, embodiments of the present invention may be used to periodically clean (e.g., etch) the undesired materials 50 from the edge environ 48 of the processed substrates 30. FIG. 3 is a schematic view showing an embodiment of apparatus 60 of the present invention for such cleaning, which protects the central area 32 of the substrate 30. During the removing of the undesired materials 50 from only the edge environ 48, the central area 32 is not damaged.

FIG. 3 shows the apparatus 60 including a vacuum processing chamber 62 having a substrate holder, or lower electrode, 64 providing a suitable clamping force to the substrate 30. The top of the chamber 62 may be provided with a chamber window, such as a dielectric window, 68. A port 70 is shown provided in the window 68 to permit access to the interior of the chamber 62. FIG. 3 also schematically shows the chamber 62 provided with facilities 74 that require access to the chamber 62 via the port 70. The facilities 74 may require such access to facilitate conducting deposition or etching or implantation processes in the chamber 62, such as by supplying process gases to the chamber. As one example of the facilities 74, process gases may be supplied from one or more gas supplies through the port 70 into the chamber 62. A pump (not shown) may reduce the pressure in the chamber 62 to a pressure in an exemplary range of 1 to 1000 milliTorr.

For removing the undesired materials 50 from only the edge environ 48 by an etching process, for example, a first source 78 of RF energy with an impedance matching circuit may be connected to a coil 80 to energize the gas in the chamber and maintain a high density (e.g., $10^{-11}$ to $10^{-12}$ ions/cm3) plasma in the chamber 62. The coil 80 may be operated at a typical fixed frequency of 13.56 MHz, and may be a type that inductively couples RF energy into the chamber 62 through the window 68 to provide the high-density plasma for conducting the processes in the chamber 62. During that coupling, the coil 80 generates an electric field (see lines 82, FIG. 3). FIG. 3 also shows that for process control, such as controlling the etching, second RF power is separately communicated to the chamber by a second RF source 84. The source 84 may include a matching network comprising variable reactances, and the matched second RF power is applied to the lower electrode 64 in the form of a second RF signal 88. The variable reactances of the matching network are controlled to match the impedance of the second RF signal 88 to the impedance of the lower electrode 64. The load coupled to the lower electrode 64 is primarily the plasma in chamber 62. The second RF signal 88 applied to the lower electrode 64 interacts with charged particles 90 (FIG. 4A) in the plasma to bias the substrate 30.

Figure 4A:
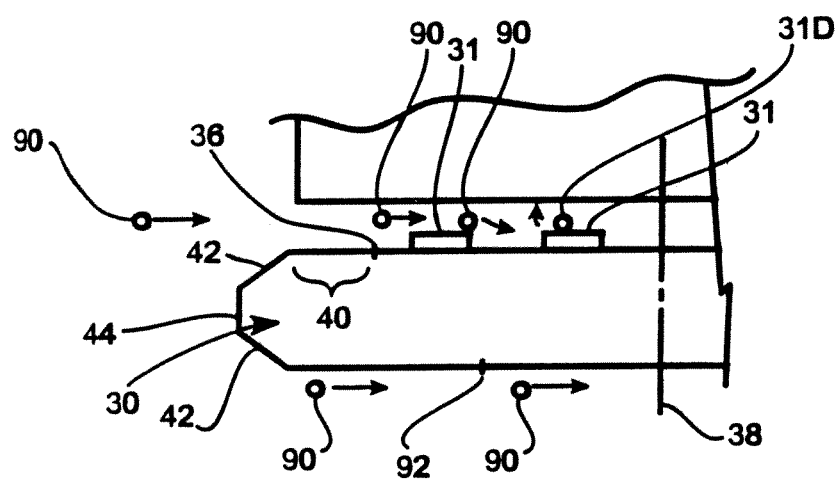
FIG. 4A is an enlarged schematic view of a portion of FIG. 3, illustrating a tendency of charged particles to move in response to bias on the substrate without embodiments of the present invention.

FIG. 4A is an enlarged schematic view of a portion of FIG. 3, illustrating a tendency of the charged particles 90 to move in response to such bias on the substrate 30. Exemplary charged particles 90 are shown moving in the process chamber 62 toward the axis 38, and moving across the edge exclusion area 40 and past the border 36 to the central area 32 and the active devices 31 that are to be protected. Particles 90 are also shown moving under the bottom surface 46 past a circular perimeter 92 that defines the portion of the bottom surface 46 that is within the edge environ 48. Such moving would occur without the embodiments of the present invention. Without the embodiments, the particles 90 would bombard and cause removal of material 31D from the devices 31, such that damage to the devices 31 may result.

Figure 4B:
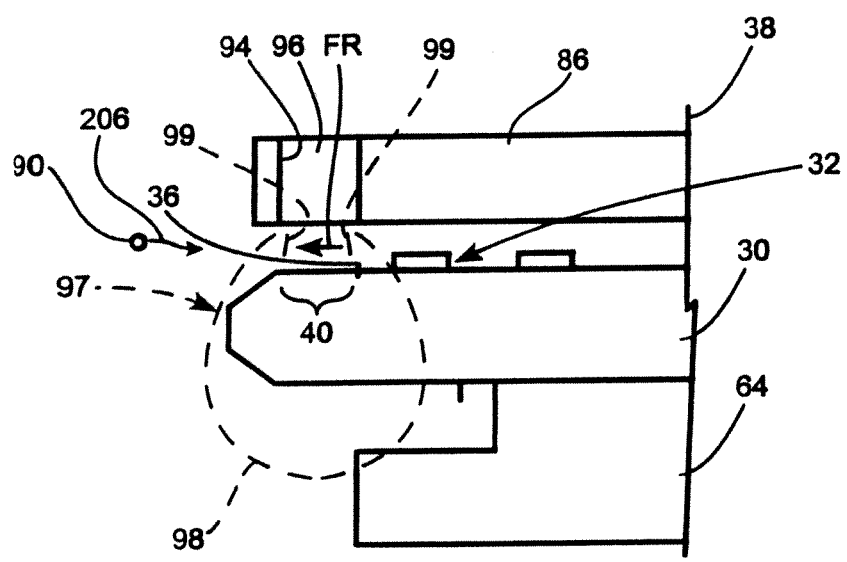
FIG. 4B is an enlarged schematic view of the apparatus of FIG. 3, further configured with a lower electrode configured to mount the substrate in a process chamber and with an upper electrode configured to protect the central area.

In a general sense, FIG. 4B shows that to protect the central area 32, the apparatus 60 may be further configured with the lower, or first, electrode 64 configured to mount the substrate 30 in the process chamber 62 with the central device area 32 within the border 36 that is centered on the wafer axis 38. As so mounted, the wafer edge exclusion area, or exclusion area, 40 (FIG. 2) extends radially away from both the axis 38 and the border 36. A second (or upper) electrode 86 may be configured with a field ring mount section 94 (also referred to as a second, or upper ring mount, section). Section 94 extends radially relative to the border 36 and away from the axis 38. A field ring arrangement 96 may be configured to establish a field 97 having a return path 98 and a peak path 99. The field 97 in the peak path 99 is capable of exerting force FR on the charged particles 90 to repel the particles 90 from moving to the central device area 32 (i.e., repel the particles 90 from moving as shown in FIG. 4A, wherein such moving may cause damage to the devices 31). The field ring arrangement 96 is mounted in the field ring mount section 94 and is configured so that the field 97 has a field strength gradient G between the return path 98 and the peak path 99. Gradient G is configured so that the peak path 99 having a peak field strength value P extends adjacent to the border 36. As used herein, "adjacent" relates to a location of the peak path 99 relative to the border 36, and in particular to the peak path 99 located in a position within a range of locations, the locations being from a location at the border 36 to a location 4 mm radially outward of the border 36. In a preferred embodiment, the peak path 99 is located in that range at a distance of 2 mm radially outward of the border 36.

The field ring arrangement 96 may be further configured to establish the peak path 99 extending adjacent to the border 36 with the gradient G defining increasing field strength inversely proportional to increased radial distance of the paths 98 and 99 away from the axis 38 and away from the border 36. With this configuration of the field ring arrangement 96, the gradient G and the peak value P of the field strength of the peak path 99 repel the charged particles 90 from moving radially past the border 36 toward the axis 38. The repelled charged particles 90 are attracted to the edge environ 48 with a force FS (not shown) and are effective to remove the undesired materials 50 from the edge environ 48, such as by sputtering.

Figure 5:
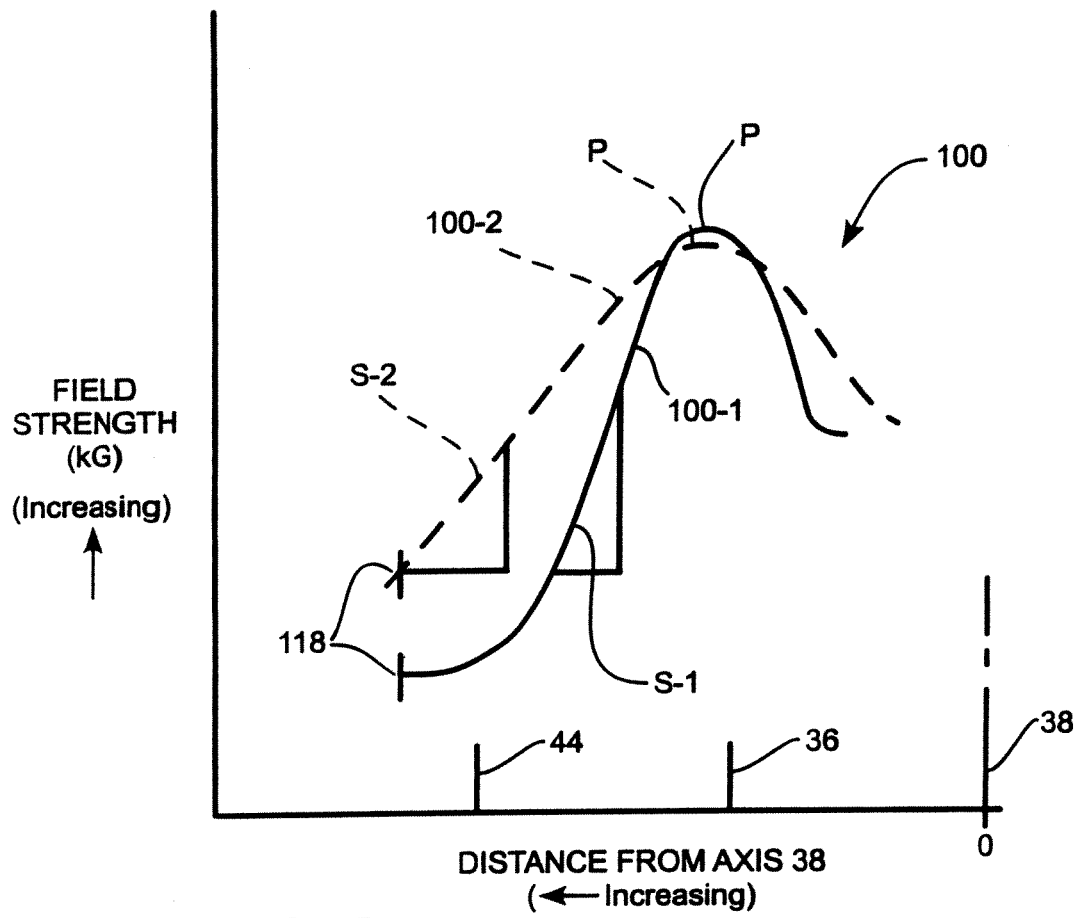
FIG. 5 is a graph showing field strength of a field resulting from a field ring arrangement vs. distance in a direction extending radially from an axis of the substrate.

FIG. 5 is a graph 100 showing field strength (i.e., strength of the field 97 resulting from the field ring arrangement 96) vs. distance in a direction (e.g., of the paths 98 and 99) extending radially from the axis 38. The distance is illustrated from the axis 38, outwardly to the left past the border 36 and past the edge 44 of the substrate 30. Corresponding to one embodiment of the arrangement 96, the graph 100 is shown including a curve 100-1 representing a typical field 97 that is a magnetic field 97M having a field strength gradient G configured with a peak value P. Value P corresponds to the value of peak path 99, and the peak path 99 extends adjacent to the border 36 (FIG. 4B). Corresponding to another embodiment of the arrangement 96, the graph 100 is shown including a curve 100-2 representing a typical field 97 that is an electric field 97E having a field strength gradient G, and field 97E may also have a peak path 99 configured with the peak value P, the peak path 99 also extending adjacent to the border 36. The exemplary curve 100-1 representing the magnetic field embodiment of the arrangement 96 is shown having the field strength gradient G (referred to as GM) further configured with a slope S-1 extending from the peak value P (of peak path 99 adjacent to the border 36). The exemplary curve 100-2 representing the electric field embodiment of the arrangement 96 is shown having the field strength gradient G (referred to as GE) further configured with a slope S-2 extending from the peak value P (of the respective peak path 99 that is adjacent to the border 36). Slope S-1 is seen illustrated as being steep, or strong. In one sense, the steep or strong slopes S-1 and S-2 indicate that the magnetic field strength of the field FM decreases suddenly from the peak value P with increased distance away from the border 36 and away from the axis 38. The sudden decrease may, for example, be from about ten kGauss (kG) per mm of such distance to about two kG per mm of such distance for slope S-1, and from about ten kG per mm of such distance to about one kG per mm of such distance for slope S-2. In a preferred embodiment of the slope S-1, the sudden decrease is about ten kG per mm of such distance. In another sense, FIG. 5 shows that for the same change of distance (e.g., from path 99 to path 98), the change of field strength per mm of such distance of slope S-1 is greater than the change of field strength of slope S-2. The slope S-1 is said to indicate a steeper or stronger field strength, such that the gradient GM of curve 100-1 is steeper or stronger relative to the gradient GE of curve 100-2.

Figure 6:
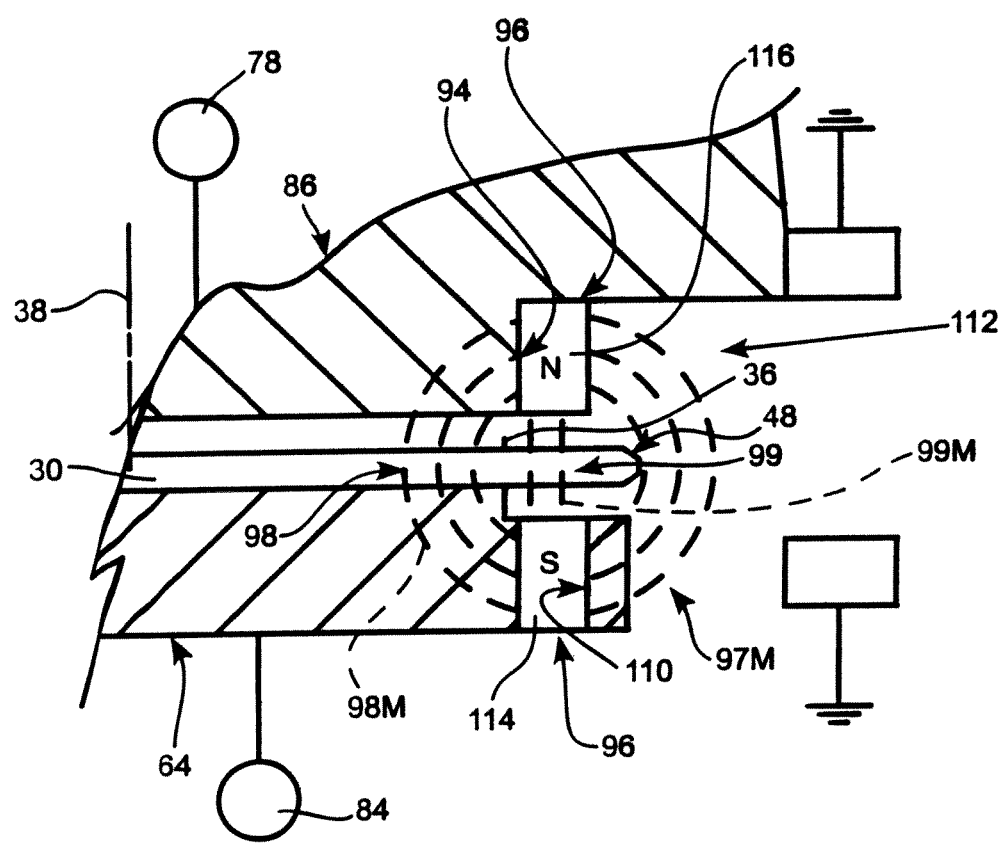
FIG. 6 is a schematic elevational view showing one embodiment of a magnetic field embodiment of the field ring arrangement.

FIG. 6 is a schematic elevational view showing one embodiment of the magnetic field embodiment of the arrangement 96, illustrating the first (lower) electrode 64 further configured with a first (or lower) field ring mount section 110 extending radially from the border 36 and away from the axis 38. In the magnetic field embodiment, the field ring arrangement 96 is configured with a ring-shaped permanent magnet arrangement 112. Arrangement 112 may be configured with a first (or lower) ring-shaped permanent magnet section 114 mounted in the first (lower) field ring mount section 110 of the first (lower) electrode 64. Arrangement 112 may also be configured with a second (upper) ring-shaped permanent magnet section 116 mounted in the field ring mount section 94 (also referred to as the second (upper) field ring mount section). The respective first and second mounted ring-shaped permanent magnet sections 112 and 114 may be configured to establish the field 97M as a magnetic field with the configured field strength gradient GM described by the exemplary graph 100-1 (FIG. 5). It may be understood that the lower field ring mount section 110 and the lower ring-shaped magnet section 114, as well as the upper mount section 94 and the upper ring-shaped magnet section 116, extend radially from the border 36 and away from the axis 38. The respective first and second mounted ring-shaped permanent magnet sections 114 and 116 may be configured to establish the magnetic field 97M having the peak path 99 extending directly between the first and second mounted permanent magnet sections 114 and 116. Field 97M includes magnetic field lines 99M extending axially directly between the respective first and second mounted permanent magnet sections 114 and 116. The respective ring-shaped sections 114 and 116 further establish the field 97M as including return lines 98M of return path 98. Paths 98 and 99 are annular paths centered on the axis 38. The respective first and second mounted permanent magnet sections 114 and 116 are further configured to establish the magnetic field 97M configured with the magnetic field strength of each path 98 or 99, for example, that is uniform around the wafer axis 38 at a given radius relative to axis 38 and that has the field strength gradient GM that varies with respect to radial distance of the path relative to the axis 38 and away from the border 36 as shown by exemplary curve 100-1 in FIG. 5.

In one embodiment of the field ring arrangement 96 configured with the ring-shaped permanent magnet arrangement 112, each magnet section 114 and 116 may be configured with cross-sectional dimensions of 0.25 inches by 0.75 inches, with the 0.25 inch dimension extending radially and with the 0.75 inch dimension extending axially. Also, each ring magnet section 114 and 116 may be configured as a NdFeB magnet providing an 11 kG field strength, which for example may provide a 10 kG peak field strength of path 99. In addition, each such magnet section may be configured with an inside radius of from about 0.25 to about 2 inches from the axis 38 to the border 36, with an outside radius varying according to the diameter of the substrate 30, e.g., 200 mm or 300 mm. Further, the section 116 may be a north pole of arrangement 112, and the section 114 may be a south pole of arrangement 112. It may be understood that other dimensions, materials, and radii may be selected according to the desired field strength, for example.

Referring again to FIG. 5, the embodiment shown in FIG. 6 may provide the field 97 as the magnetic field 97M having the characteristics shown in curve 100-1 that represents the field strength gradient GM for the field 97M. The above exemplary inside radii of the rings 114 and 116 are measured to the border 36 so that the inside radii are vertically aligned with the border 36, for example. The gradient GM defines magnetic field strength that is inversely proportional to increased radial distance of the exemplary paths 98 & 99 away from the axis 38 (to the left in FIG. 5). The variation of the gradient GM is also from the peak value P of path 99 located adjacent to the border 36. The gradient GM and the value of the peak P of the field strength are configured to repel the charged particles 90 from moving radially past the border 36 toward the axis 38. The repelled charged particles 90 are attracted to the edge environ 48 with the force FS that is effective to remove the undesired materials 50 from the edge environ 48, such as by sputtering.

The field strength gradient GM is further configured with the slope S-1 extending from the peak value P (of path 99 that is adjacent to the border 36), such that the strong gradient GM may be effective on the charged particles 90 as described below. Because the ring-shaped magnet sections 114 & 116 are configured so that the field strength of the magnetic field FM is very low (e.g., less than 10 G) at return path 98 at an exemplary radial distance of about twenty mm from the border (corresponding to a point 118), the magnetic field FM does not become highly effective on the charged particles 90 until the particles 90 are within the above-described range of about zero to 4 mm radially outward from the border 36 (corresponding to the peak value of the peak path 99, FIG. 5), and at that peak value P of path 99 the field 97M is most effective and the particles 90 are suddenly repelled by the force FR from passing the border 36 and from moving further toward the axis 38. As a result, the charged particles 90 may be more and more acted on by the field FM that applies the force FS to attract the particles 90 toward the substrate 30 as the particles move radially inward toward the border 36. In this manner, before more and more of the charged particles 90 reach the border 36 such particles will bombard the edge environ 48, including bombarding the edge exclusion area 40, and will remove undesired materials 50 from the edge environ 48. Then, those charged particles 90 that reach the border 36 are suddenly repelled from passing the border 36 and from moving further toward the axis 38, and will further bombard the edge environ 48 rather than moving further toward the axis 38.

Figure 7:
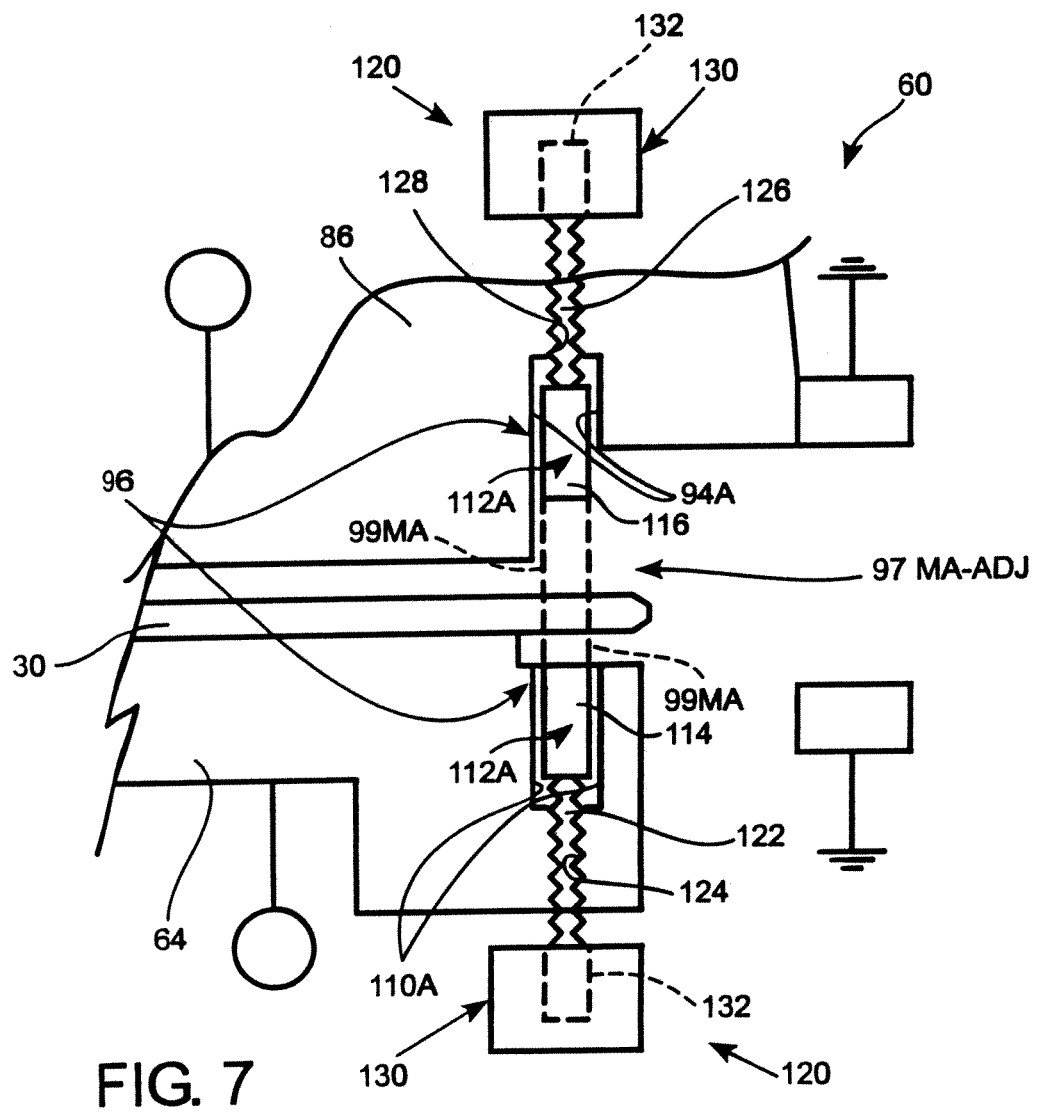
FIG. 7 is a schematic view similar to FIG. 6, showing an embodiment of apparatus with one or both of first and second ring mount sections configured to adjustably mount first and second permanent magnet sections for movement relative to each other in a direction parallel to the axis.

FIG. 7 is a schematic view similar to FIG. 6, showing an embodiment of the apparatus 60 wherein one or both of the respective first and second ring mount sections 110 and 94 is configured to adjustably mount the respective first and second permanent magnet sections 114 and 116 for movement relative to each other in a direction parallel to the axis 38 (i.e., axially). In the axially adjustable magnetic field embodiment of FIG. 7, the field ring arrangement 96 is configured with the ring-shaped permanent magnet arrangement 112 (referred to as 112A) configured with the first (or lower) ring-shaped permanent magnet section 114 mounted for axial movement in the field ring mount section 110 (referred to as 110A). The section 110A is configured to extend axially more than the axial dimension of the first ring-shaped permanent magnet section 114. The section 110A is thus configured to permit the lower magnet section 114 to be adjusted axially relative to the upper magnet section 116. In one embodiment, the field ring arrangement 96 is configured so that the ring-shaped permanent magnet arrangement 112A is configured with only the first ring-shaped permanent magnet section 114 mounted for axial movement in the field ring mount section 110A, so that the second (upper) ring-shaped permanent magnet section 116 is fixed to electrode 86.

In another embodiment shown in FIG. 7, the field ring arrangement 96 is configured so that each of the respective lower and upper ring-shaped permanent magnet sections 114 and 116 is mounted for axial movement. Thus FIG. 7 shows the field ring mount section 94 (referred to as 94A) configured to extend axially more than the axial dimension of the second (upper) ring-shaped permanent magnet section 116. The section 94A is thus configured to permit the upper magnet section 116 to be adjusted axially relative to the lower magnet section 114. The section 110A is configured to extend axially more than the axial dimension of the first ring-shaped permanent magnet section 114. The section 110A is thus configured to permit the lower magnet section 114 to be adjusted axially relative to the upper magnet section 116.

In yet another embodiment, the field ring arrangement 96 is configured so that the ring-shaped permanent magnet arrangement 112A is configured with only the second (upper) ring-shaped permanent magnet section 116 mounted for axial movement in the field ring mount section 94A, so that the first (lower) ring-shaped permanent magnet section 114 is fixed to the mount 110.

In the various embodiments described with respect to FIG. 7, the axial adjustment of the respective first and second mounted ring-shaped permanent magnet sections 114 and 116 may be by use of an adjustment device 120. An exemplary device 120 is shown as a screw 122 configured for reception in a threaded hole 124 in the respective lower electrode 64. Another exemplary device 120 is shown as a screw 126 configured for reception in a threaded hole 128 in the respective upper electrode 86. Adjustment of the appropriate exemplary screw 122 or 126, or of another configuration of the device 120, may be by a controller 130. The controller 130 may be effective to adjust the configuration of the field 97M (FIG. 6) to define the field as an axially-adjustable-strength magnetic field, referred to as 97MA-ADJ.

In one embodiment, the controller 130 may be a computer-controlled motor 132 operated according to a recipe for the operation of removing the undesired material 50 from the edge environ 48. The field 97MA-ADJ may be configured so that the field strength gradient G (referred to as GMADJ) is described by exemplary graphs 100-3, 100-4, & 100-5 in FIG. 8. It may be understood that in the FIG. 7 embodiment, the lower ring-shaped magnet section 114, with the upper ring-shaped magnet section 116, configure the field 97MA-ADJ (with the field strength gradient GMADJ) to extend radially from the border 36 and away from the axis 38. Also, once adjusted, the respective first and second sections 114 and 116 are configured to establish the magnetic field 97MA-ADJ extending between the respective first and second mounted permanent magnet sections 114 and 116 in the same manner as described with respect to FIG. 6. For clarity of illustration, FIG. 7 does not show, but the field 97MA-ADJ of FIG. 7 includes, the return path 98 and return lines 98MA; and peak path 99, with magnetic field lines 99MA, that extend axially directly between the respective first and second adjustable permanent magnet sections 114 and 116. For the FIG. 7 embodiment, the respective ring-shaped sections 114 and 116 establish the field 97MA-ADJ including those return lines 98MA of return path 98 and those magnetic field lines 99MA of peak path 99. The field 97MA-ADJ and paths 98M & 99M are also annular, centered on the axis 38. The established magnetic field 97MA-ADJ is also configured with the magnetic field strength that at a given radius is uniform around the wafer axis 38 and that has the field strength gradient GMADJ that varies with respect to radial distance of exemplary paths 98M & 99M relative to the axis 38 and away from the border 36 as shown by the curves 100-3 to 100-5 in FIG. 8.

Figure 8:
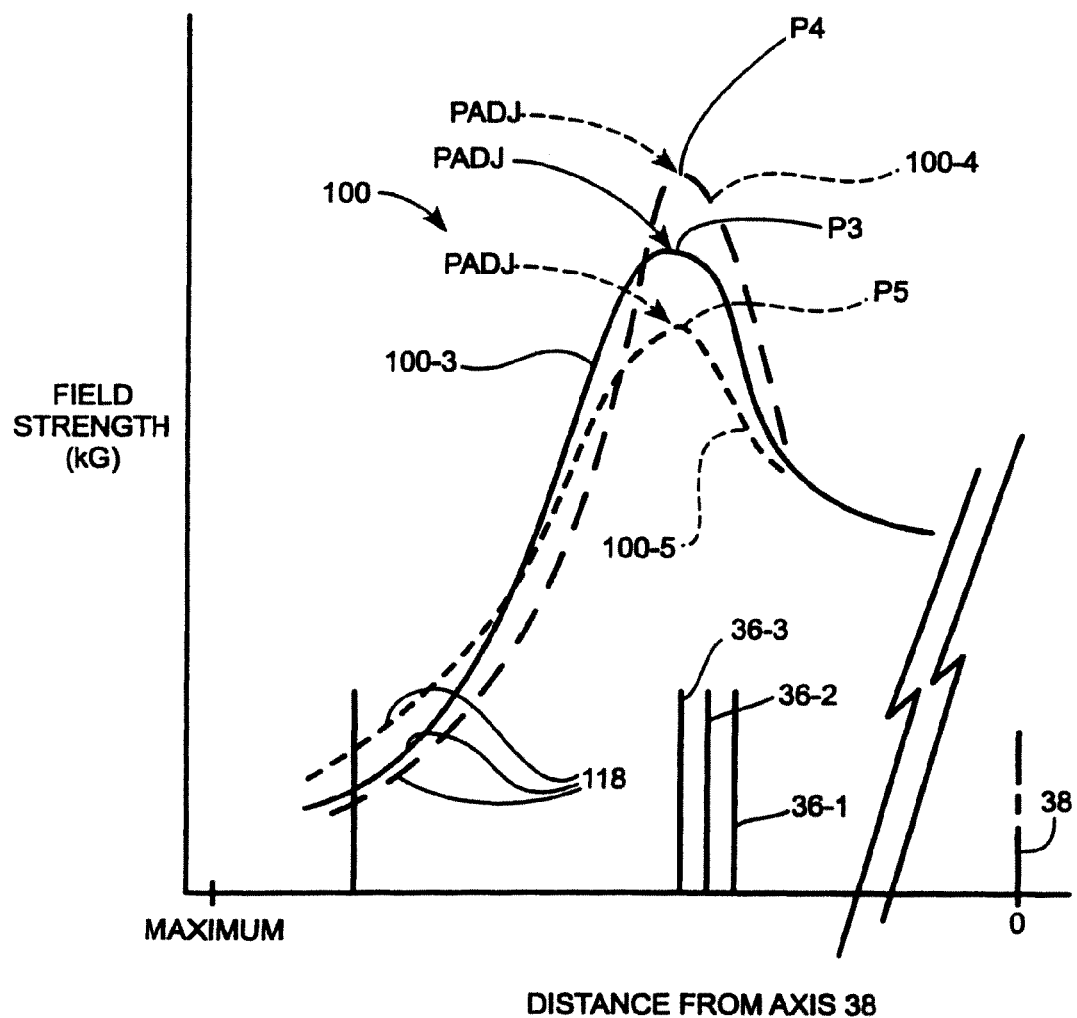
FIG. 8 is a graph showing field strength of a field resulting from a field ring arrangement vs. distance in a direction extending radially from the axis, wherein the field is configured so that a field strength gradient varies as shown by exemplary curves.

Referring to FIG. 8, generally, curves 100-3 to 100-5 show that a peak value PADJ (of path 99) of the field 97MA-ADJ may be adjusted, i.e., controlled. As shown, exemplary adjustment may be that there is a higher peak value P4 of curve 100-4 (dash-dash line) than peak P3 of curve 100-3 (solid line), or there may be an exemplary lower peak value P5 of curve 100-5 (dot-dot line) than peak values P3 & P4. Different peak values PADJ may be obtained by using the controller 130 and motor 132 to control rotation of the exemplary screws 122 or 126 to move either or both of the sections 114 and/or 116 closer to the other section, for example. This relative movement results in adjustment of the peak value of the field strength gradient GMADJ of the peak path 99, e.g., as the sections 114 & 116 become closer the peak value PADJ may change from P5, to P3, to P4. The reverse may be obtained by reverse rotation of the screws to move either or both of the sections 114 and/or 116 further apart from the other section, for example.

As described above, the field strength of the magnetic field FM is very low (e.g., less than 10 G) at the exemplary radial distance of about twenty mm of the exemplary path 98 from the border 36 (as shown in FIG. 8 by the low points 118 of the curves 100-3 to 100-5). Also described was that the magnetic field FM does not become highly effective on the charged particles 90 until the particles 90 are within the above-described range of from about zero to about 4 mm radially outward from the border 36 (corresponding to the peak values P3 to P5) of peak path 99. The amount of the effectiveness of the magnetic field FM becomes greater as the peak value P increases, and is thus highest by the configuration of the sections 114 and 116 positioned axially closest to each other to provide the peak value P4 of the path 99 (as compared to providing peak values P3 and P5 of path 99). Thus, such configuration providing peak value P4 of path 99 will have the greatest illustrated effectiveness on the particles 90 (as compared to peak values P3 or P5) so that with peak value P4 the particles will be subjected to a strongest repelling force FR most suddenly repelled (as compared to peak values P3 or P5) from passing the border 36 and from moving further toward the axis 38, and will be most attracted toward the substrate 30 as the particles move radially inward toward the border 36 to path 99 (as compared to peak values P3 or P5). In this manner, few of the charged particles 90 will pass the border 36, providing a maximum protection of the central area 32 and minimizing damage to the devices 31 (as compared to peak values P3 or P5).

In one embodiment of the apparatus 60 also relating to FIG. 7, the configuration of the sections 114 and 116 positioned axially to provide the adjustable values of the peak magnetic field strength may be used to provide protection for the central areas 32 when, for example, different substrates 30 to be protected are configured with respective borders 36 at different radial locations relative to the axis 38 of the respective substrate. In this example, the respective borders 36 define different radial extents of the central area 32 relative to the wafer edge exclusion area 40, where the central area 32 is to be protected from the charged particles 90. As described above, the configurations of the respective first and second ring mount sections 110 & 94 allow movement of the respective first and second permanent magnet sections 114 & 116 relative to each other in the axial direction to control the peak value P of the magnetic field strength of the magnetic field FM according to the radial location of the border 36 with respect to the axis 38. As described with respect to FIG. 8, for example, for the same peak path 99, the adjustable mounting and movement may provide a lower peak value (e.g., P5) corresponding to an exemplary first radial location of the border 36 close to the axis 38, and may provide a greater peak value (e.g., P4) of the peak magnetic field strength corresponding to an exemplary second radial location of the border 36 further away from the axis 38 than the first radial location. It may be understood that with the lower value of the peak P5, there is less force FR (FIG. 4B) on the charged particles 90 and more time before the lower peak value P5 of the field acts on the charged particles 90. In this case, the particles 90 may travel longer radially inward toward axis 38. This longer travel is acceptable because the exemplary border 36 is closer to the axis 38. It may be understood that with the higher peak value P4, there is more force FR on the charged particles 90 and less time before the peak value P4 of the field acts on the charged particles 90. Thus, the particles 90 travel less radially inward (i.e., less toward the axis 38), which less travel is desired because the exemplary border 36 is further away from the axis 38.

In review, the configurations of the respective first and second ring mount sections 110 & 94 allow movement of the respective first and second permanent magnet sections 114 & 116 relative to each other in the axial direction. That movement under the control of controller 130 controls the peak value P of the magnetic field strength of the magnetic field FM in path 99 according to the radial location of the border 36 with respect to the axis 38. As an illustration of the peak value P being according to the radial location of the border 36 with respect to the axis 38, for the path 99, the adjustable mounting and movement provide a lower peak value (e.g., P5, FIG. 8) corresponding to an exemplary first radial location (e.g., 36-1, FIG. 8) of the border 36 close to the axis and provide a greater value (e.g., P4) of the peak magnetic field strength corresponding to a second radial location (e.g., 36-2 or 36-3, FIG. 8) of the border 36 further away from the axis 38 than the first radial location 36-1. Thus, the reference to magnetic field strength of the magnetic field F "according to the radial location of the border 36 with respect to the axis 38" describes the effect of the field FM for a given radii of the magnets relative to the central axis 38 (determined by the axial locations of the mount section 94 or 110), and with a selected relative vertical spacing of sections 114 & 116. This effect is to configure the field strength according to the exemplary different substrate configurations having the respective border 36 at different radial locations (e.g., 36-1, 36-2, & 36-3), such that the charged particles 90 may be allowed to move radially inward across the edge exclusion area 40 by various distances before being repelled by the force FR that is a maximum at the peak value P.

Figure 9:
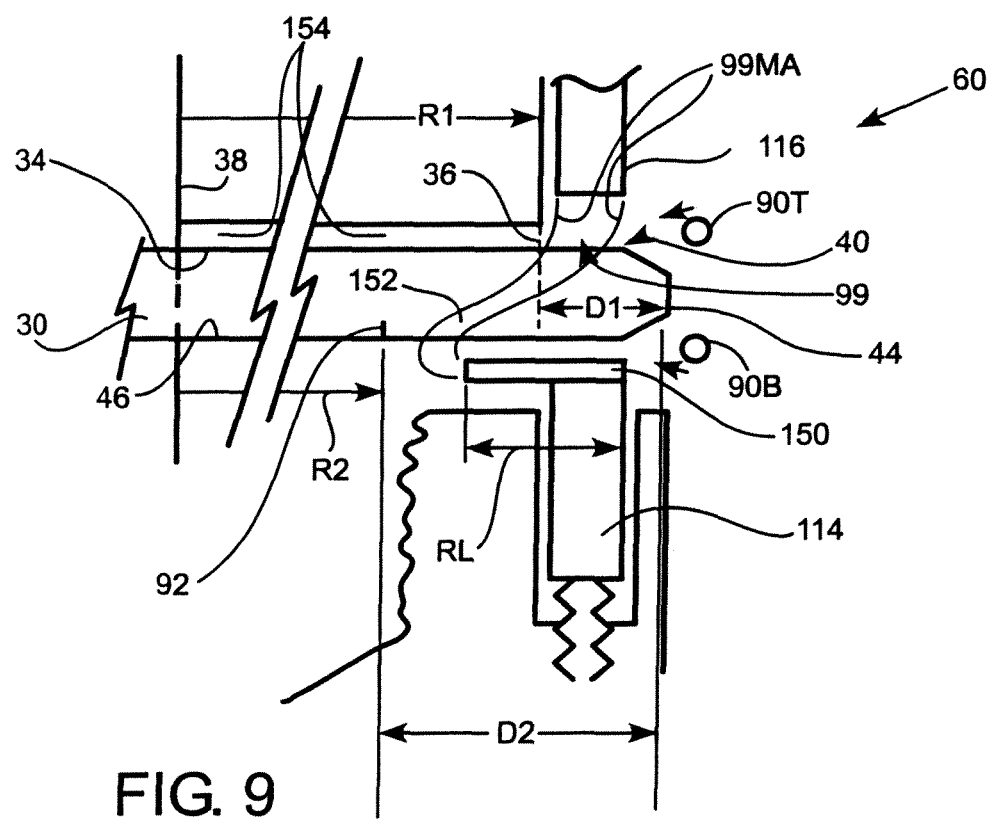
FIG. 9 illustrates configurations of first and second permanent magnet sections to control the location of a peak path of the magnetic field between the magnet sections according to a desired extent of radial movement of charged particles across top and bottom surfaces of the substrate.

In one embodiment shown in FIG. 9, the apparatus 60 may be configured so that the field strength is also controlled according to other substrate configurations. For example, another substrate configuration may be as follows. The radial extent of the edge exclusion area 40 (that is not to be protected & that is on the top surface 34 of the substrate 30) may have one value, a distance D1 radially in from the edge 44 & toward the axis 38. There may also be a radial extent of the bottom surface 46 (that is not to be protected), and this may have another value, a distance D2 radially in from the edge 44 to a perimeter 92. Distance D2 is usually greater than distance D1. For these exemplary distances D1 & D2, before being repelled by the force FR (FIG. 4B) that is a maximum at the peak value P, the charged particles 90 should be allowed to move radially inward across the bottom surface 46 toward the axis 38 to the perimeter 92 through distance D2 that is greater than distance D1. Distance D1 is the desired amount of movement of the particles 90 radially in across the edge exclusion area 40 to the border 36 on top surface 34.

FIG. 9 illustrates the configurations of the respective first and second permanent magnet sections 114 & 116 to control the location of the peak path 99 of the magnetic field FM between the sections 114 & 116 according to the desired extent of radial movement of the charged particles 90 across the respective top and bottom surfaces 34 & 46. The following is an illustration of the path 99 of the magnetic field FM being according to this desired extent of radial movement of the charged particles 90. With the sections 114 and 116 at a selected axial position, one section, here shown as the exemplary lower section 114, is configured with a flux plate 150 secured to the section 114. The flux plate may be an axially thin annular member extending radially from the section 114. The flux plate 150 is fabricated from metal or other suitable material so that the flux plate diverts the peak path 99 from that shown in FIG. 6, for example. FIG. 9 shows that the diverted peak path 99 and the field lines 99MA in path 99 initially extend axially from the upper magnet section 116 and into the edge exclusion area 40 of the wafer 30 adjacent to the border 36. As the field lines 99MA of the peak path 99 enter the edge exclusion area 40, the path 99 and lines 99MA are redirected from axial into a redirected path 152 that extends radially and axially through the wafer 30 and diagonally toward the axis 38 and across a space 154 between the sections 114 & 116. The redirected path 152 extends axially past (and radially outside of) the perimeter 92 to the flux plate 150 attached to the lower section 114. Thus, the flux plate 150 is configured to redirect the field FM from the direct axial path 99 (shown in FIGS. 6 & 8), and into the described redirected path 152. Since the perimeter 92 is radially toward the axis 38 more than the border 36, the redirected path 152 thus extends closer to the axis 38 under the substrate 30 than above the substrate. Thus, the flux plate 150 is effective below the substrate 30 to position the peak field strength FM radially in with respect to the border 36. The flux plate 150 is also configured with a radial length to select an amount of the radial redirection (or diversion) of the path 152 so as to locate the peak value P of the radially diverted magnetic field FM (in path 152) at a selectable radial location relative to the axis 38. An exemplary radial location is identified as RL. It may be understood, then, that the flux plate 150 is configured to locate the peak path 99 of the field strength according to the exemplary different substrate configurations that require the particles 90 to bombard the surfaces 34 and 46 at different radial locations relative to the axis 38. According to the configuration of the flux plate, charged particles 90 may thus be allowed to move radially inward toward the axis 38 by different radial distances. Thus, particles 90T may move a different radial distance across the top surface 34 than particles 90B move across the bottom surface 46 before being repelled by the force FR that is a maximum at the peak value P.

In review, by the configuration of the flux plate 150, the apparatus 60 is configured for protecting different substrates 30, the different substrates being configured with the border 36 and the perimeter 92 at different radial locations relative to the axis 38 of the respective substrate. The different radial locations of the border 36 are indicated by the above-described distance D1, for example, and the different radial locations of the perimeter 92 are indicated by the above-described distance D2, for example. The flux plate 150 is thus configured to radially divert the peak path 99 of the axially extending magnetic field MF so that the amount of the radial diversion locates the peak value P of the radially diverted magnetic field MF according to the radial location of the border 36 of one of the different substrates relative to the axis 38, and according to the radial location of the perimeter 92 on the bottom 46 of the wafer 30.

Figure 10:
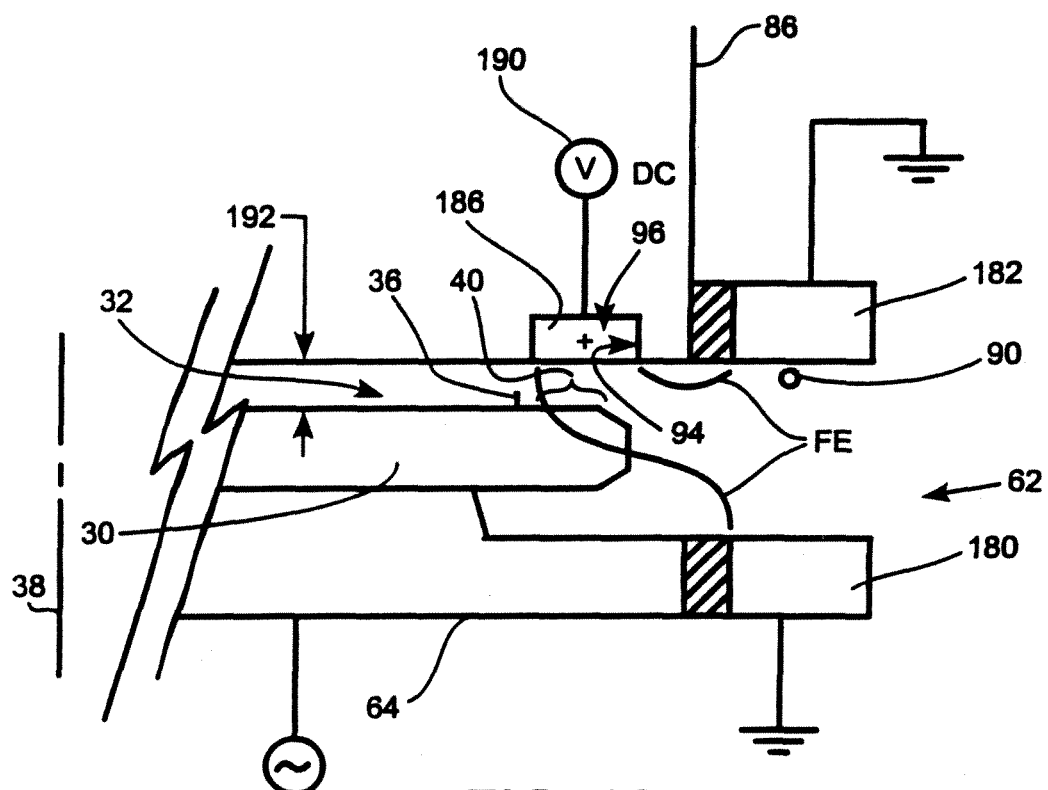
FIG. 10 is a schematic view showing an embodiment of the apparatus of FIG. 3, in which a field ring mount section and a field ring arrangement are configured to establish an electric field for protecting the central area of the substrate from the charged particles in the process chamber.

As described above, FIG. 3 shows the upper electrode 86 configured with the field ring mount section 94, and the field ring arrangement 96 configured to establish the field 97 having a return path 98 and a peak path 99. FIG. 10 shows another embodiment of the apparatus 60 of FIG. 3, in which the field ring mount section 94 and the field ring arrangement 96 may be configured for protecting the central area 32 of the substrate 30 from the charged particles 90 in the process chamber 62. The first (lower) electrode 64 is configured to mount the substrate 30 as described above, and the border 36 may be configurable at any of a plurality of radial distances relative to the axis 38. The first electrode 64 is configured with a first electrically grounded ring 180 extending in an annular path radially outward of the edge exclusion area 40 (away from axis 38) and electrically isolated from the wafer support 64.

Different configurations of the edge exclusion area 40 may be defined by the border 36 positioned at different ones of a plurality of radial distances relative to the axis 38. The second (or upper) electrode 86 is configured with the annular mount section 94 aligned with the border 36. The second electrode 86 is further configured with a second electrically grounded ring 182 extending in an annular path radially outward of the edge exclusion area 40 and electrically isolated from the center area 32 and from the first annular mount section 94. The first annular mount section 94 is electrically isolated from the center area 32 as well. The field ring arrangement 96 may be configured with a DC bias ring 186 secured to the first annular mount section 94 to establish the electric field FE in the process chamber 62. The DC bias ring 186 is configured so that the electric field FE extends away from the circular border 32 and across the edge exclusion area (bracket 40) to each of the respective first and second grounded rings 180 and 182 to repel the charged particles 90 from crossing the border 36 and to promote etching of the edge exclusion area 40. The field ring arrangement 96 may be configured further with a DC control circuit 190 for applying a DC voltage to the DC bias ring 186. The circuit 190 is configured so that the DC bias ring applies a positive DC voltage to establish the electric field FE. The positive DC voltage establishes the electric field FE and repels positively charged particles 90 from crossing the border 36 and promotes etching of the edge exclusion area 48 by the repelled positively charged particles 90. for a particular value of a distance 192 between the wafer 30 and the ring 186, a value of the positive DC voltage may be directly proportional to a value of the radial distance of the border 36 relative to the axis 38. For example, the positive DC bias voltage may be in a range of from about one volt to about 200 volts when distance 192 is about one mil.

In one embodiment, the DC control circuit 190 is configured for applying different DC voltages to the DC bias ring 186 to establish different strengths of the electric field FE. A first strength may have a first value corresponding to a first of the radial distances, and a second strength having a second value corresponding to a second of the radial distances. The second radial distance is further away from the axis 38 than the first radial distance, and the second value exceeds the first value.

In another embodiment, the first annular mount section 94 extends in a circular path opposite to the annular edge exclusion area 40. Also, the DC bias ring 186 is configured so that the electric field FE extends radially away from the circular border 36 and all around the edge exclusion area 40 so that the movement of the charged particles 90 across the border 36 is repelled all around the border and bombardment of the edge exclusion area 40 by the repelled particles 90 is promoted all around the edge exclusion area 40. The electric field FE may be as shown in FIG. 5 by curve 100-2.

Figure 11:
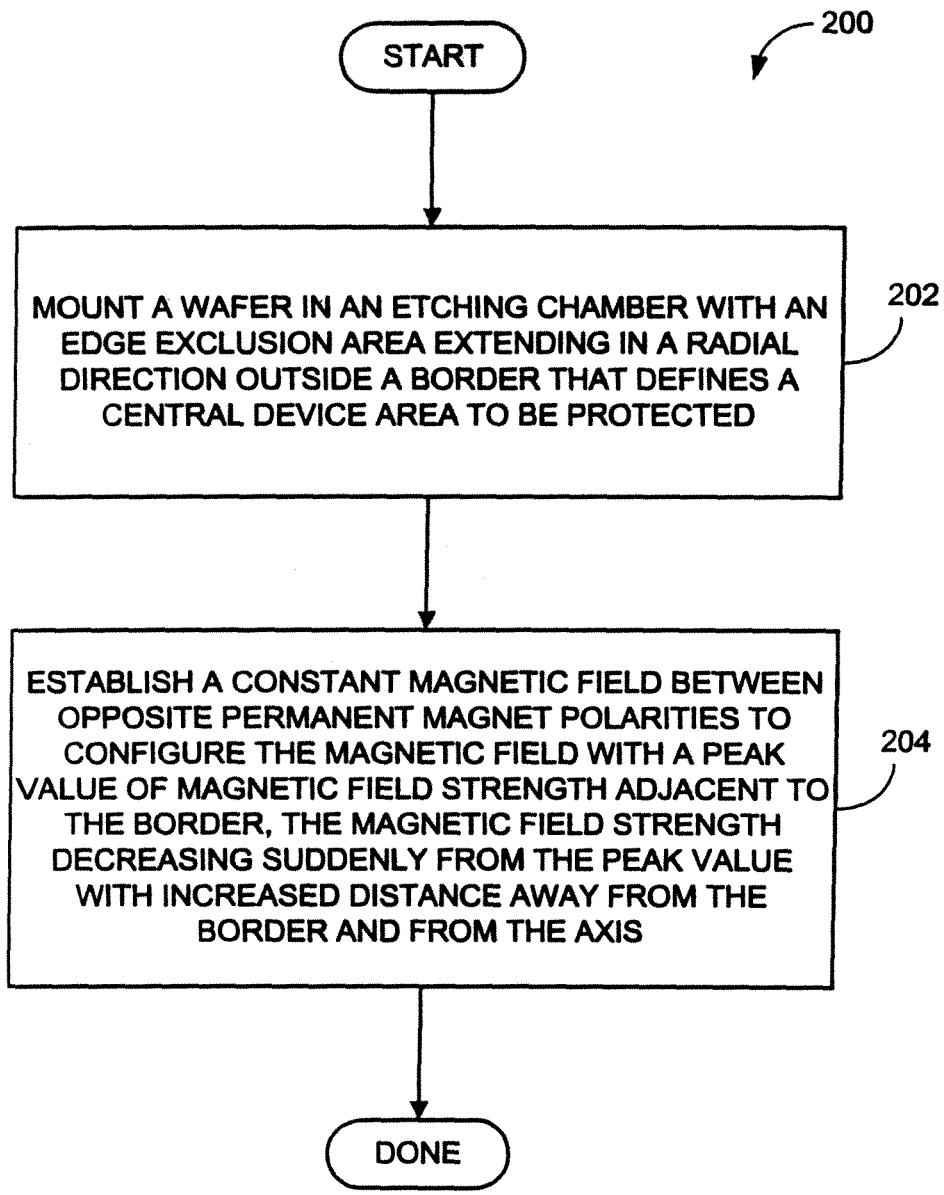
FIG. 11 is a diagram showing a flow chart, illustrating operations of a method of protecting the central area of the substrate from charged particles during etching.

FIG. 11 is a diagram showing a flow chart 200, illustrating operations of a method of protecting a central area of a wafer from charged particles during etching of an edge exclusion area surrounding a circular border that defines the central area. The central area may be area 32 of the substrate 30, and the charged particles may be particles 90 that occur during etching of the edge exclusion area 40 surrounding the circular border 36 that defines the central area 32. The method may move from start to an operation 202 of mounting the wafer in an etching chamber with the edge exclusion area extending in a radial direction outside a border that defines a central device area to be protected. The mounting may be as shown in any of FIG. 6, 7 or 9, for example. The wafer 30 is thus mounted in the etching chamber 62 with the edge exclusion area 40 extending in the radial direction outside the border 36 and perpendicular to the axis 36. The method may move to an operation 204 of establishing a constant magnetic field between opposite permanent magnet polarities. The establishing configures the magnetic field to provide a peak value of magnetic field strength that is adjacent to the border. The magnetic field strength of the established magnetic field decreases suddenly from the peak value with increased distance away from the border and from the axis. The peak value of the magnetic field and sudden decrease of the magnetic field strength repel movement of charged particles past the border to the central region and promote bombardment of the edge exclusion area by the repelled particles. The establishing of the constant magnetic field between opposite permanent magnet polarities relates to the field FM at the exemplary peak value P of graph 100-1 in FIG. 5, for example. As described in respect to FIGS. 5 & 6, for example, the establishing provides the peak value P of magnetic field strength that is adjacent to the border 36. The magnetic field strength of the field FM is shown in FIG. 5 decreasing suddenly from the peak value P with increased distance away from the border 36 and away from the axis 38. As described above, the peak value P of the magnetic field FM and the sudden decrease of the magnetic field strength repel movement (FIG. 4B, arrow 206) of charged particles 90 past the border 36 to the central region 32 and promote bombardment of the edge exclusion area 40 by the repelled particles 90. The method is then done.

Figure 12:
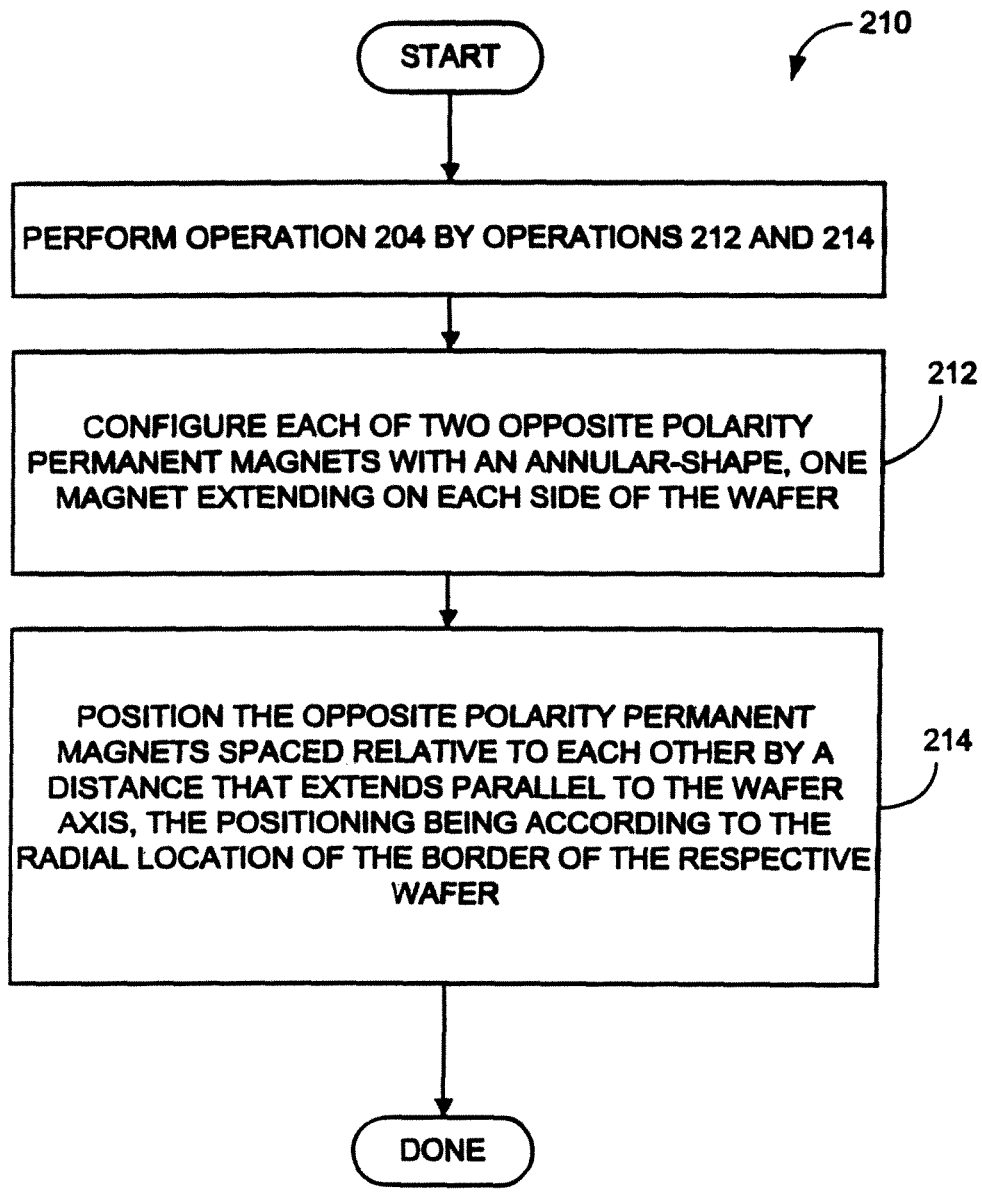
FIG. 12 is a diagram showing a flow chart, illustrating operations of a method for controlling a value of peak magnetic field strength of a magnetic field that extends through the substrate at the edge exclusion area, the control being according to a radial location of a border with respect to a central axis of the substrate.

In one embodiment shown in flow chart 210 of FIG. 12, the method may control the value of the peak magnetic field strength of the magnetic field, wherein the magnetic field extends through the wafer at the edge exclusion area, and wherein the control of the value is according to a radial location of the border with respect to a central axis of the wafer. The control of the value may be of the peak value P (FIG. 5) of the strength of the magnetic field FM. The field FM may extend axially through the wafer 30 as shown in FIG. 6, for example. The peak value P may be controlled according to the radial location of the border 36. As described above, the location of the border is a radial location with respect to the central axis 38 of the wafer 30, such that the radial location may be measured from the axis 38 radially outwardly toward the edge 44. FIG. 12 shows the flow chart 210 illustrating further aspects of operation 204 for controlling the peak value P. The method moves from operation 202 to operation 204. Operation 204 is first performed by a further operation 212 of configuring each of two opposite polarity permanent magnet sections with an annular-shape, one magnet section extending on each side of the wafer. The configuring may be of the exemplary ring-shaped north polarity of permanent magnet section 116 and of the exemplary ring-shaped south polarity of section 114. As described above and shown in FIGS. 1 and 6, each section 114 and 116 is configured with an annular (i.e., ring) shape. FIGS. 6 and 7, for example, show the section 114 on one side (lower) of the wafer 30, and the section 116 on the other side (upper) of the wafer 30.

The method moves to a further operation 214 of positioning the opposite polarity permanent magnets spaced relative to each other by a distance that extends parallel to the wafer axis, the positioning being according to the radial location of the border of the respective wafer. By reference to the above description of FIG. 8, the positioning of the magnets according to the radial location of the border of the respective wafer may be understood. For the same peak path 99 of the magnetic field FM, the adjustable mounting and axial relative movement of the magnet sections 114 and 116 may provide a lower peak value (e.g., P5) corresponding to an exemplary first radial location of the border 36 close to the axis 38, and may provide a greater value (e.g., P4) of the peak magnetic field strength corresponding to an exemplary second radial location of the border 36 further away from the axis 38 than the first radial location. By reference to FIG. 5, it may be understood that in the various axial positions of the sections 114 and 116, the magnetic field strength decreases suddenly from the peak value P adjacent to the border 36. Also, by reference to FIG. 7, for example, it may be understood that the positioning may be positioning of the opposite polarity permanent magnet sections 114 and 116 spaced relative to each other, and the spacing is by a vertical (i.e., axial) distance extending parallel to the wafer axis 38. The method is then done.

Figure 13:
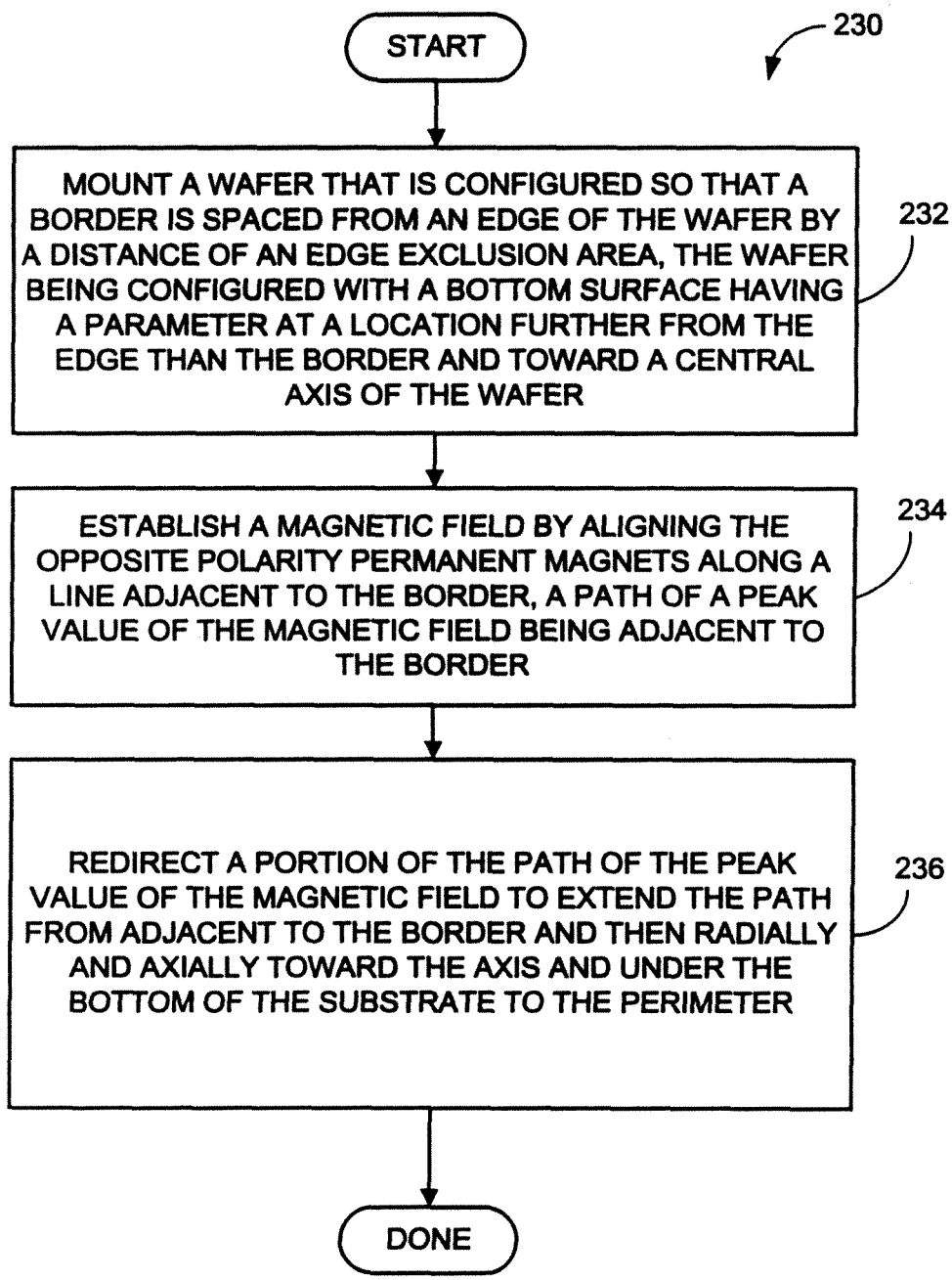
FIG. 13 is a diagram showing a flow chart, illustrating operations of a method that controls a location of a peak path of a magnetic field between sections of magnets according to a desired extent of radial movement of charged particles across top and bottom surfaces of the substrate.

FIG. 13 illustrates one embodiment of a method that is described by a flow chart 230. The method may control the location of a peak path of the magnetic field between sections of the magnets according to a desired extent of radial movement of the charged particles across top and bottom surfaces of the wafer. The location controlled may be the location of the peak path 99 of the magnetic field FM between the magnet sections 114 & 116 according to the desired extent of radial movement of the charged particles 90 across the respective top and bottom surfaces 34 & 46 of the wafer 30. Thus, in the controlled location, the field FM in peak path 99 may protect different areas of the top and bottom surfaces 34 and 45 of the wafer 30 from charged particles 90 in the process chamber 62.

FIG. 13 shows that the method may move from start to an operation 232 of mounting a wafer that is configured so that a border is spaced from an edge of the wafer by a distance of an edge exclusion area, the wafer being configured with a bottom surface having a perimeter at a location further from the edge than the border and toward a central axis of the wafer. The wafer may be the wafer 30 (FIG. 1) configured so that the border 36 is spaced from the edge 44 of the wafer by a radial distance (e.g., D1) relating to the edge exclusion area 40 and the bevel 42. The wafer 30 may be configured with the bottom surface 46 having the perimeter 92 (FIG. 9) at a location further from the edge 44 than the border 36 (i.e., more toward the central axis 38 of the wafer 30 than the border). Thus, as shown in FIG. 9, the bottom area between the bevel 42 and the perimeter 92 may be greater than the edge exclusion area 40 between the border 36 and the bevel 42 near the edge 44, yet both such areas are to be protected. The method may move to operation 234 of establishing a magnetic field by aligning the opposite polarity permanent magnets along a line adjacent to the border so that a peak path of a peak value of the magnetic field is adjacent to the border. The magnetic field strength may decrease suddenly from the peak value with increased distance away from the border and from the axis. The operation 234 of establishing the magnetic field between opposite permanent magnet polarities may relate to the field FM at the exemplary peak value P of graph 100-1 in FIG. 5, for example. As described in respect to FIGS. 5 & 6, for example, the establishing provides the peak value P of magnetic field strength of the peak path 99 that is adjacent to the border 36. The magnetic field strength of the field FM is shown in FIG. 5 decreasing suddenly from the peak value P with increased distance away from the border 36 and away from the axis 38. The path 99 of the peak magnetic field FM may originate as an axially extending path that is vertically aligned with the upper magnetic section 116 as shown in FIG. 9, for example.

The method may move to operation 236 of redirecting a portion of the path of the peak value of the magnetic field so that the path extends from adjacent to the border and then radially and axially toward the axis and under the bottom of the substrate to the perimeter. The magnetic field strength may decrease suddenly from the peak value with increased distance away from the path, i.e., away from the path that extends between the perimeter and the border. The redirecting may be of the portion 152 of the path 99 of the peak value P of the magnetic field FM. The redirecting may be as shown in FIG. 9, in which the peak path 99 extends initially axially from the upper magnet section 116 and into the edge exclusion area 40 of the wafer 30 adjacent to the border 36. The path 99 and lines are redirected from axial into the redirected path 152 that extends radially and axially through the wafer 30, diagonally toward the axis 38 and across the space 154 and past the perimeter 92 to the flux plate 150.

In review, by the configuration of the flux plate 150, the apparatus 60 is configured for protecting different substrates 30, the different substrates being configured with the border 36 and the perimeter 92 at different radial locations relative to the axis 38 of the respective substrate. The different radial locations of the border 36 are indicated by the above-described distance D1, for example, and the different radial locations of the perimeter 92 are indicated by the above-described distance D2, for example. The flux plate 150 is thus configured to radially divert the peak path 99 of the axially extending magnetic field MF so that the amount of the radial diversion locates the peak value P of the radially diverted magnetic field MF according to the radial location of the border 36 of one of the different substrates relative to the axis 38, and according to the radial location of the perimeter 92 on the bottom 46 of the wafer 30.

In view of the above descriptions, it may be understood that the various embodiments of the present invention provide ways of protecting the central area 32 so that during the removing of the undesired materials 50 from the edge environ 48 the central area is not damaged, i.e., the removal is only from the edge environ 48. Also, by selecting one embodiment of the arrangement 96, e.g., the magnet sections 114 and 116, these sections provide characteristics of the typical field 97 as shown in curve 100-1 for the magnetic field 97M. The field 97M has the field strength gradient GM configured with the peak path 99 having the peak value P, and the path 99 extends adjacent to the border 36. By selecting another embodiment of the arrangement 96, e.g., the DC bias ring 186, the ring provides characteristics of another typical field 97 as shown in curve 100-2 for the electric field 97E. Field 97E has the field strength gradient GE also configured with the peak path 99 configured with the peak value P, and the path 99 also extending adjacent to the border 36.

The exemplary curve 100-1 representing the magnetic field embodiment of the arrangement 96 is shown having the field strength gradient GM further configured with the slope S-1 extending from the peak value P (of path 99 adjacent to the border 36). Slope S-1 is seen illustrated as being steep, or strong, as defined above, in that for the same change of distance (e.g., from path 99 to path 98), the change of field strength of slope S-1 is greater than the change of field strength of slope S-2.

In the embodiment of FIG. 6, and in the embodiment of the method of FIG. 11, the first and second mounted ring-shaped permanent magnet sections 114 and 116 are configured to establish the magnetic field 97M having the peak path 99 extending directly between the first and second mounted permanent magnet sections 114 and 116. Magnetic field lines 99MA extend axially (parallel to the axis 38) directly between the first and second mounted permanent magnet sections 114 and 116. The ring-shaped sections 114 and 116 further establish the field 97M uniform around the wafer axis 38 and having the field strength gradient GM varying with respect to radial distance of the path relative to the axis 38 and away from the border 36 as shown by curve 100-1 in FIG. 5.

FIGS. 7 & 8 show that the field 97MA-ADJ may be configured so that the field strength gradient GADJ is described by exemplary graphs 100-3, 100-4, & 100-5 (FIG. 8), illustrating control of variable peak field strength by way of relative axial positioning of the lower ring-shaped magnet section 114 with respect to the upper ring-shaped magnet section 116. The field 97A-ADJ (with the field strength gradient GADJ) is also configured to extend radially from the border 36 and away from the axis 38, with the magnetic field 97MA-ADJ extending between the first and second mounted permanent magnet sections 114 and 116. The field 97MA-ADJ includes peak path 99 with magnetic field lines 99MA extending axially (parallel to the axis 38) directly between the first and second adjustable permanent magnet sections 114 and 116. The field 97MA-ADJ and paths 98 & 99 are also annular and uniform around the wafer axis 38 and that has the field strength gradient GMADJ that varies with respect to radial distance of exemplary paths 98 & 99 relative to the axis 38 and away from the border 36 as shown by the curves 100-3 to 100-5 in FIG. 8.

For any given peak path 99, there may be control of the value of the peak field strength. In a method aspect of this axial positioning, operation 214 (FIG. 12) positions the opposite polarity permanent magnets 114 and 116 spaced relative to each other by a distance that extends parallel to the wafer axis 38. The positioning is according to the radial location of the border 36 of the respective wafer 30. Thus, for the same radial location of the peak path 99 of the magnetic field FM, the adjustable mounting and axial relative movement of the magnet sections 114 and 116 may provide the lower peak value (e.g., P5) corresponding to the exemplary first radial location 36-1 of the border 36 closest to the axis 38, and may provide the exemplary greatest value (e.g., P4) of the peak magnetic field strength corresponding to the exemplary third radial location 36-3 of the border 36 further away from the axis 38 (i.e., than the first and second radial locations.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. Apparatus for protecting a central die area of a wafer from charged particles in a process chamber, the apparatus comprising:
    a bottom electrode configured to mount the wafer in the process chamber with the central area within a circular wafer border centered on a wafer axis and with a wafer edge exclusion area extending radially relative to the axis and outside the border, the bottom electrode having a support surface and a step down surface with a first ring mount section;
    a top electrode having a surface that opposes the support surface of the bottom electrode and a step up surface with a second ring mount section;
    a bottom grounded electrode disposed around the bottom electrode at a level of the step down surface;
    a top grounded electrode disposed around the top electrode at a level of the step up surface; and
    a ring-shaped permanent magnet arrangement configured with a first permanent magnet section mounted in the first ring mount section and a second permanent magnet section mounted in the second ring mount section, the first and second mounted permanent magnet sections being configured to establish a magnetic field that extends axially between the first and second mounted permanent magnet sections and in an annular path centered on the axis, the first and second mounted permanent magnet sections being further configured to establish the magnetic field configured with a magnetic field strength that is uniform around the wafer axis and that has a field strength gradient that varies with respect to radial distance relative to the axis and away from the border, the gradient variation being from a peak value located adjacent to the border and inversely proportional to increased radial distance away from the axis, the gradient and the peak value of the field strength being configured to repel the charged particles from moving radially past the border toward the axis, wherein
    the first and second ring mount sections are further configured to adjustably mount the respective first and second permanent magnet sections for movement relative to each other in a direction parallel to the axis.

2. Apparatus as recited in claim 1, wherein:
    different wafers to be protected are configured with respective borders at different radial locations relative to the axis of the respective wafer, the respective borders define different radial extents of the central die area relative to the wafer edge exclusion area to be protected from the charged particles; and
    the configurations of the first and second ring mount sections allow movement of the respective first and second permanent magnet sections relative to each other in the direction parallel to the axis to control the peak value of the magnetic field strength of the magnetic field according to the radial location of the border of the wafer with respect to the axis.

3. Apparatus as recited in claim 2, wherein the adjustably mounting and movement provide a lower peak value corresponding to a first radial location of the border close to the axis and provide a greater value of the peak magnetic field strength corresponding to a second radial location of the border further away from the axis than the first radial location.

4. Apparatus as recited in claim 1, wherein:
    the apparatus further comprises a flux plate mounted between the first and second permanent magnet sections to radially divert the axially extending magnetic field from extending directly axially and to extend axially and radially between the first and second mounted permanent magnet sections.

5. Apparatus as recited in claim 4, wherein:
    the flux plate is configured to select an amount of the radial diversion so as to locate the peak value of the radially diverted magnetic field at a selectable radial location relative to the axis.

6. Apparatus as recited in claim 4, wherein:
    the apparatus is configured for protecting different wafers, the different wafers being configured with the border at different radial locations relative to the axis of the respective wafer.

7. Apparatus as recited in claim 6, wherein:
    the flux plate is configured to radially divert the axially extending magnetic field so that the amount of the radial diversion locates the peak value of the radially diverted magnetic field according to the radial location of the border of one of the different wafers relative to the axis.

8. A chamber for processing a bevel edge of a substrate, comprising:
    a bottom electrode defined to support a substrate in the chamber, the bottom electrode having a bottom first level for supporting the substrate and a bottom second level near an outer edge of bottom electrode, the bottom second level defined at a step below the bottom first level;

a top electrode oriented above the bottom electrode, the top electrode having a top first level and a top second level, the top first level being opposite the bottom first level and the top second level being opposite the bottom second level, the top second level defined at a step above the top first level;

a bottom grounded electrode disposed around the bottom electrode at the bottom second level;

a top grounded electrode disposed around the top electrode at the top second level;

a bottom ring mount oriented at the bottom second level, the bottom ring mount includes a first adjuster for moving a bottom permanent magnet toward and away from the top electrode; and a top ring mount oriented at the top second level, the top ring mount includes a second adjuster for moving a top permanent magnet toward and away from the bottom electrode.

9. The chamber of claim 8, wherein the first and second adjusters are defined by at least one controller or motor.

10. The chamber of claim 8, wherein the top permanent magnet is oriented opposite the bottom permanent magnet.

11. The chamber of claim 8, wherein the top and bottom permanent magnets are one of a south pole magnet and one of a north pole magnet.

12. The chamber of claim 8, wherein the top second level and the bottom second level are opposite of each other, and define a region for plasma etching of the substrate edge when present.

13. The chamber of claim 8, further comprising a first RF power connection to the top electrode and a second RF power connection to the bottom electrode.

14. A chamber for etching a bevel edge of a substrate, comprising:

a lower electrode defined to support a substrate in the chamber for plasma etching when powered, the lower electrode having a first level for supporting the substrate and a second level near an outer edge of lower electrode, the second level defined at a step below the first level;

an upper electrode oriented above the lower electrode, the upper electrode having a first level and a second level, the first level of the upper electrode being opposite the first level of the lower electrode and the second level of the upper electrode being opposite the second level of the lower electrode, the second level of upper electrode defined at a step above the first level of the upper electrode;

a bottom grounded electrode disposed around the lower electrode at the second level of the lower electrode;

a top grounded electrode disposed around the upper electrode at the second level of the upper electrode;

a lower ring mount oriented at the second level of the lower electrode, the lower ring mount includes a first adjuster for moving a first permanent magnet toward and away from the upper electrode; and an upper ring mount oriented at the second level of the upper electrode, the upper ring mount includes a second adjuster for moving a second permanent magnet toward and away from the lower electrode;

wherein movement of the first or second permanent magnets is toward or away from the first or second permanent magnets.

15. The chamber of claim 14, wherein a separation between the first levels of the upper and lower electrodes is less than a separation between the second levels of the upper and lower electrodes.

16. The chamber of claim 14, wherein a region for plasma etching of a substrate edge, when the substrate is present, is defined between the second levels of the upper and lower electrodes.

17. The chamber of claim 14, further comprising a first RF power connection to the upper electrode and a second RF power connection to the lower electrode.

\* \* \* \* \*